United States Patent

Krafthefer

[15] 3,706,954

[45] Dec. 19, 1972

[54] CONNECTOR AND ARRANGEMENT FOR CIRCUIT BOARD ASSEMBLY THEREWITH

[72] Inventor: Kerry M. Krafthefer, Downers Grove, Ill.

[73] Assignee: Molex Incorporated, Downers Grove, Ill.

[22] Filed: Dec. 28, 1970

[21] Appl. No.: 101,468

Related U.S. Application Data

[63] Continuation-in-part of Ser. No. 57,689, July 23, 1970.

[52] U.S. Cl. ............339/17 L, 339/59 M, 339/75 M, 339/91 R, 339/218 R

[51] Int. Cl. ............................H01r 9/08, H05k 1/02

[58] Field of Search....339/17 F, 17 L, 17 LM, 17 M, 339/176 M, 176 MF, 176 MP, 91 R, 75 R, 75 MP, 75 M, 119 R, 125 R, 126, 218, 45, 220, 59, 61

[56] References Cited

UNITED STATES PATENTS

| | | | |
|---|---|---|---|
| 3,567,998 | 3/1971 | Ammerman | 339/17 L X |
| 3,543,226 | 11/1970 | Laboue | 339/221 M |
| 3,525,972 | 8/1970 | Asick et al. | 339/17 L X |
| 3,596,235 | 7/1971 | Teurlings | 339/176 MP X |

FOREIGN PATENTS OR APPLICATIONS

| | | | |
|---|---|---|---|
| 866,052 | 4/1961 | Great Britain | 339/75 MP |
| 1,512,787 | 6/1969 | Germany | 339/176 M |

*Primary Examiner*—Robert L. Wolfe
*Assistant Examiner*—Terrell P. Lewis
*Attorney*—Olson, Trexler, Wolters & Bushnell

[57] ABSTRACT

An electrical connector has a series of terminals therein each with a tongue that projects from the connector, the tongue being soldered to a circuit board. The connector has depending ledges which support an edge portion of the circuit board remote from the soldered connection to resist rupture of the soldered connection upon bending of the circuit board. In another arrangement a circuit board has pin conductors and a lock wafer adjacent to the board and through which the pins project and are secured. The pins also are adapted to project into the connector for connection with the terminals. The lock wafer has a flexible lip that engages a shoulder on the connector to prevent separation of the circuit board and connector.

16 Claims, 6 Drawing Figures

Inventor
Kerry M. Krafthefer
By: Olson, Trexler, Wolters & Bushnell attys

CONNECTOR AND ARRANGEMENT FOR CIRCUIT BOARD ASSEMBLY THEREWITH

This application is a continuation-in-part of my copending application, Ser. No. 57,689 filed July 23, 1970.

This invention relates to electrical connectors and to arrangements for maintaining such connectors in assembled relationship with circuit boards.

In the electrical connection of a printed circuit board to a series of terminals within a connector, the terminals may have tongues that project from the connector and are soldered to circuit elements of the circuit board. Sometimes, however, the board is subjected to a bending that tends to exert a stress on the soldered connections causing them to rupture.

Accordingly, an object of this invention is to provide an arrangement wherein a circuit board is supported by the connector in a manner to resist rupture of the solder joints between the terminals and the printed circuit board.

A further object of this invention is to provide an arrangement of the type stated wherein the connector has depending ledges for supporting an edge portion of the circuit board remote from the solder connections of the tongues. In such arrangement the edge portion of the circuit board is confined between the body of the connector and the ledges, whereby bending or flexing of the circuit board in opposite directions is resisted sufficiently to avoid breakage of the solder joints between the terminal tongues and the circuit board.

A further problem in connecting a printed circuit board to a connector containing terminals lies in the retention of the board in assembled relationship with the connector. In one arrangement the circuit board has a series of parallel pin type conductors soldered thereto and projecting therefrom. The pins are plugged into a connector having a series of recesses in which resilient terminals are located. The resilient pressure of the terminals on the pin-conductors provides firm electrical contact between the two and, to some extent, retains the pin-conductors within the connector. However, in some instances it has been found that the retentive forces applied by the terminals, are insufficient to insure positive maintenance of the pin-conductors in electrical-contacting positions with the terminals.

It is, therefore, a further object of the present invention to provide an arrangement in which the printed circuit board and connector are mechanically locked together against accidental separation without having to rely upon the spring pressure of the terminals against the pin-conductors. In accordance with this object of the invention a lock wafer is secured to the pin-conductors and is interposed between the circuit board and the connector. The lock wafer has a resilient finger that snaps over a shoulder on the connector when the circuit board and connector are assembled.

The attainment of the above and further objects of this invention will be apparent from the following detailed description taken in conjunction with the accompanying drawing forming a part thereof.

In the drawing.

Like reference numerals indicate like parts throughout the drawing.

Figure 1:
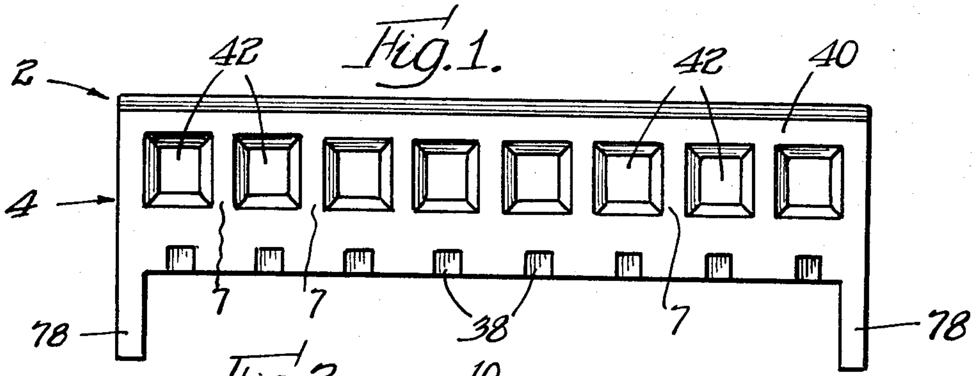
FIG. 1 is a rear elevational view of a connector constructed in accordance with and embodying the present invention.

Referring now in more detail to the drawing, 2 designates a connector of dielectric material, such as molded nylon or other suitable plastic, and as having an elongated one piece body 4. The connector has a series of spaced apart parallel recesses 6 which open up at the front face 8 of the body 4 for receiving a series of electrical terminals 10, one of which is shown herein. The recesses are separated by spaced walls 7.

The terminal 10 is fabricated of a single piece of sheet brass which is formed to the shape shown and spring tempered to provide a resilient body. The terminal 10 has a base 12 with a lance 14, the base including a tail piece 16 with crimping arms 18, 18 for crimping a wire 20. Furthermore, the terminal 10 includes at its forward end an arcuate first junction portion 22 which curves upwardly and rearwardly. The junction portion 22 merges with a contact-making leg 24 which lies at an acute angle to the base 12. The leg 24 merges with a reversely curved junction portion 26, and the junction portion 26 merges with an additional leg 28 that terminates in a lip 30, the latter being slidable on the base 12. From the foregoing it will be apparent that the terminal is generally oval-shaped and is capable of a modicum flattening.

At the opposite side of each recess 6 the connector 2 is formed with a laterally projecting rib 32 that cooperates with the connector bottom wall 34 to provide spaces or slots that receive the lateral edge portions of the terminal base 12 and serve to locate the terminal 10 in a predetermined position within the recess 6. For this purpose each rib 32 has a stop shoulder 35 that serves to limit the insertion of the terminal 10 into the recess 6. Formed in the bottom wall 34 is a slot 38 for receiving the lance 14 and by which retraction of the terminal 10 from the recess is prevented. The rear edge 40 of the connector body 4 has a series of openings 42 which are located substantially at the upper portion of the rear edge 40.

The normal height of the terminal 10 is greater than the height of the recess 6. Consequently, when a terminal 10 is inserted into a recess 6 the terminal will flatten somewhat as it is confined between the top and bottom walls of the connector.

Provided for a plug-in connection with the connector 2 is a circuit board or panel 44 having a plurality of spaced parallel pin-conductors 46 secured to circuit wiring 48 on the board 44 by solder connections 50. In the present embodiment of the invention the conductors 46 are of square cross sections and substantially companion with the square cross sections of the openings 42. Furthermore, it will be apparent that the center-to-center spacing of the conductors 46 will correspond to the center-to-center spacing of the openings 42.

The conductors 46 are mounted in a plastic lock wafer 52 having a generally flat body 54 that is flush against the circuit board 44 and confined between the circuit board 44 and the connector body 4 when the conductors 46 are plugged into the connector. The conductors 46 are rigidly secured to the wafer body 54 in any suitable manner and project therethrough so as to extend a substantial distance beyond the opposite faces of the body 54. If a series of conductors 46 is assembled with the wafer 52, the latter may be used to plug the pins 46 as a group through respective preformed openings in the circuit board 44 after which the pins 46 may be soldered in place. At the upper edge thereof, the wafer body 54 is integrally provided with a resilient finger 56 that is adapted to flex about a hinge connection 58. The resilient finger 56 furthermore includes a generally V-shaped portion 60 which serves to lock with the connector 4. For this purpose the edge 40 at the top wall of the connector is integrally molded with a ridge 62 having an inclined face 64 and a vertical shoulder 66.

With the wafer 52 and pins 46 assembled and with the latter soldered to the circuit board 44, the pins 46 are inserted into the respective openings 42 to depress or further flatten the terminals 10, resulting in the terminals applying resilient contact pressure to the pins. The apex of the V portion 60 rides along the inclined surface 64, finally snapping therepast and seating against the shoulder 66. The circuit board 44 is now locked against accidental disassembly from the connector 2, and can only be disassembled by prying up the V shaped portion 60 until it clears the top of the ridge 62.

Figures 2, 3, 4, 5, 6:
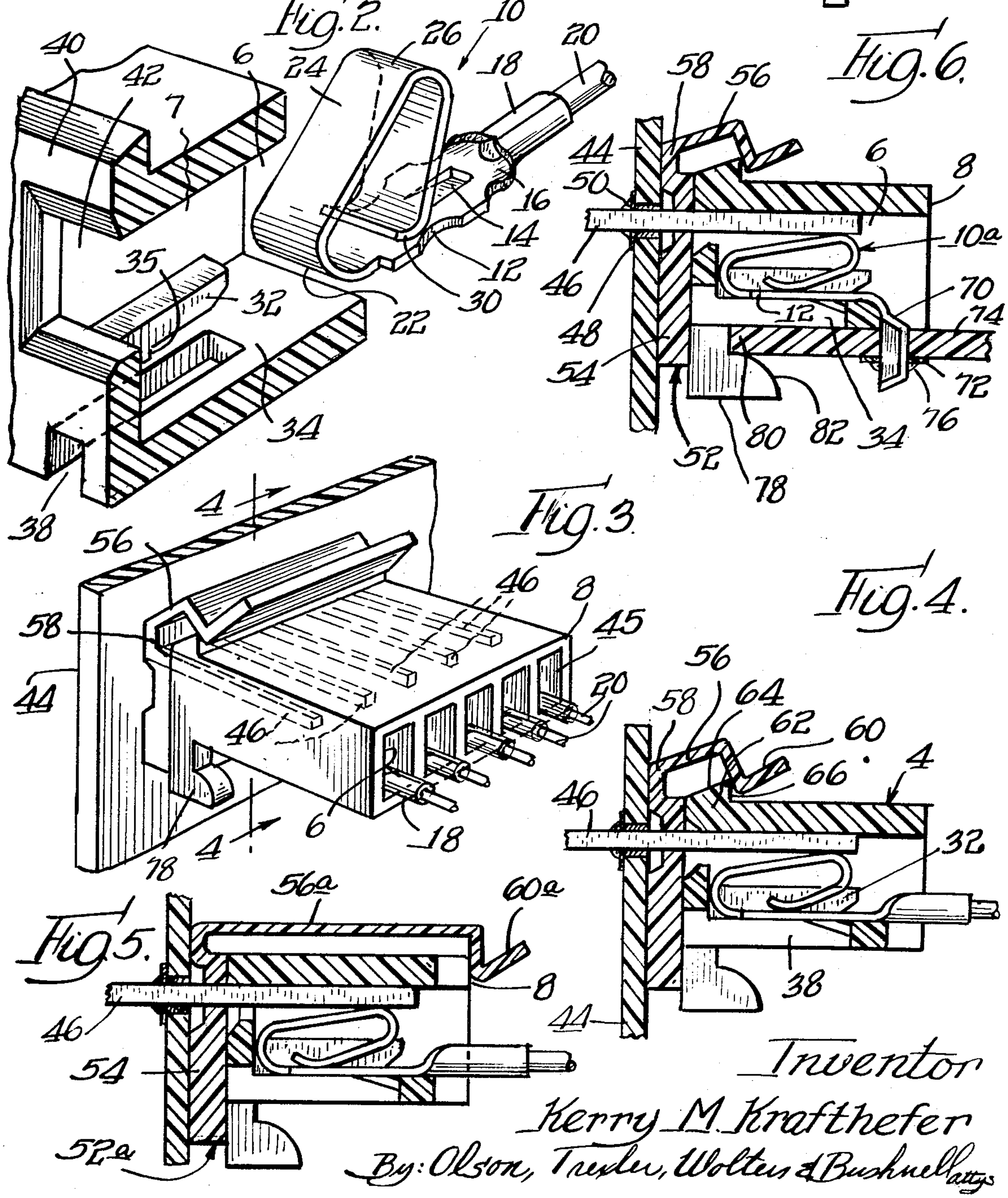
FIG. 2 is a fragmentary perspective view, partially in section, of the connector and terminal forming part of the present invention.
FIG. 3 is a perspective view of a pin-terminal containing circuit board assembled with a connector.
FIG. 4 is a fragmentary sectional view taken along line 4—4 of FIG. 3.
FIG. 5 is a sectional view similar to FIG. 4 but showing a modified form of lock wafer.
FIG. 6 is a sectional view showing a further embodiment of the invention.

FIG. 5 shows a modified form of lock wafer **52*a* having a body 54. However, the resilient finger 56*a* is of different construction than in the lock wafer 52 in that the V shaped portion 60*a* engages a shoulder formed by the front face or edge 8 of the connector. Thus the finger 56*a* spans the full width of the connector. The connector of FIG. 5 may, if desired, be made without the ridge 62** as it is no longer needed for this arrangement.

Referring now to FIG. 6 there is shown a terminal **10*a* which is in all respects like the terminal 10 except that the terminal 10*a* is not crimped to a wire and therefore omits the crimping arms. There is a further difference in that the terminal 10*a* has a tongue 70 that is turned at substantially right angles to the base 12 and projects outwardly from the connector body 4 at the front side thereof. The tongue 70 is mechanically and electrically connected to a circuit element 72 on a printed circuit panel or board 74 by a solder joint 76 such that the general plane of the circuit board 74 is substantially parallel to the bottom wall 34 of the connector. While only one terminal 10*a* is shown in FIG. 6 it will be understood that there are like terminals in the respective connector recesses 6**.

Since the tongue 70 projects through the circuit board 74 and is soldered thereto, a mechanical and electrical connection is provided. However, there is a possibility that one or more of the solder joints 76 of the several terminals **10*a* may become ruptured. To avoid the foregoing difficulty the connector body 4 may be integrally molded at its opposite ends with depending L-shaped ledges 78, 78 which engage and support an edge portion 80 of the circuit board 74 that is remote from each solder joint 76. Each ledge 78 has a tapered surface 82 whereby circuit boards of varying thicknesses may be supported thereon and confined between such surface 82 and the bottom wall 34 of the connector body 4. By so supporting the edge portion 80 of the circuit board 74, there is provided an improved resistance to breakage of the solder joints 76 upon application of forces tending to bend the circuit board 74. For example, a downward vertical force on the circuit board 74 a substantial distance to the right (FIG. 6) of the solder joint 76 will result in a stress at the solder joints 76, which tend to act as a fulcrum. However, the edge portion 80 is restrained by the bottom wall of the connector body 4 to resist movement of the circuit board 74. If an upward vertical force is applied, the edge portion 80 is supported by the inclined surface 82 of the ledges 78. In either case the resistance to movement of the edge portion 80 reduces the stress on a solder joint 76** and possible rupture thereof.

While two ledges 78 at opposite ends of the connector are shown, it will be apparent that for wide boards and connectors, additional depending ledges may be molded with the connector intermediate the ends thereof.

The invention is claimed as follows:

1. In combination with an electrical connector having a recess, an electrical terminal in said recess, cooperating means on the connector and terminal for retaining said terminal in said recess, a tongue on said terminal and projecting outwardly of said recess, a first circuit-containing member that receives said tongue exteriorly of said connector, means for joining said tongue to said member and including a solder connection for electrically connecting the tongue to circuitry on said member, a second circuit-containing member having a conductor projecting into said recess for engagement with said terminal and with the terminal applying pressure to said conductor, said connector having a bottom wall extending between opposite edges of the connector, and spaced apart L-shaped ledges depending from said bottom wall at one of said edges and opening toward the other edge and toward said connection.

2. A combination according to claim 1 in which the two circuit-containing members are panels containing printed circuits, and the terminal is a generally oval shaped structure that is partially flattened upon insertion of said conductor into said recess.

3. A combination according to claim 2 in which said ledges project away from the second circuit-containing member.

4. In combination with an electrical connector having a recess, an electrical terminal in said recess, cooperating means on the connector and terminal for retaining said terminal in said recess, a tongue on said terminal and projecting outwardly of said recess, a first circuit-containing member that receives said tongue exteriorly of said connector, means for joining said tongue to said member and including a solder connection for electrically connecting the tongue to circuitry on said member, and a second circuit-containing member having a conductor projecting into said recess for engagement with said terminal and with the terminal applying pressure to said conductor, said connector having projecting means for supporting an edge portion of said first circuit-containing member remote from said connection, a lock wafer, said conductor being secured to and projecting through said wafer, said wafer being located between said connector and second circuit-containing member, and said connector and wafer having cooperating overlapping portions engageable to facilitate retaining said connector assembled with said second circuit-containing member.

5. A combination according to claim 4 in which the cooperating portion on the connector is adjacent to an edge thereof that is proximate to said second circuit-containing member.

6. A combination according to claim 4 in which the cooperating portion on the connector is adjacent to an edge thereof that is remote from said second circuit-containing member such that the cooperating part on the wafer spans the width of said connector.

7. In combination with an electrical connector having a recess, an electrical terminal in said recess and having a tongue projecting from said recess, a circuit board adjacent to said connector, said tongue projecting through the circuit board and being soldered thereto, and said connector having projecting means remote from the soldered connection for supporting an edge portion of the board to resist rupture of the soldered connection due to a force on the board tending to bend it for movement of said edge portion against said projecting means, said projecting means being at one edge of the connector and the tongue extends outwardly of the connector at the opposite edge of the connector.

8. A combination according to claim 7 in which said projecting means comprise spaced apart ledges integral with the connector and facing toward said opposite edge.

9. In combination a circuit board, a lock wafer, a plurality of spaced apart conductor elements rigidly secured to the lock wafer and soldered to said circuit board, a connector having recesses with terminals therein, said conductors projecting into said recesses respectively, said terminals imposing resilient pressure on said conductors, and cooperating releasable overlapping means on the wafer and the connector for preventing separation of the two.

10. A combination according to claim 9 in which said cooperating means on said wafer comprises a resilient finger that engages a shoulder on said connector.

11. A combination according to claim 10 in which said shoulder is at an edge of the connector that is opposite to said wafer such that the resilient finger substantially spans the width of said connector.

12. A combination according to claim 9 in which said cooperating means on said wafer comprises a resilient finger and the cooperating means on said connector comprises an inclined ridge such that upon relative movement of the connector and wafer the finger will ride over said ridge and snap into seating position on a shoulder therebehind.

13. An electrical connector comprising a body with a series of side-by-side discrete terminal-receiving recesses and with there being a wall between adjacent recesses, said recesses opening to opposite edges of said connector body, means in said connector for limiting the penetration of terminals inserted into said recesses, and an inclined ridge at one of said edges and being on the exterior of the body.

14. A connector according to claim 13 further including generally L shaped ledges at said one edge, said ledge and ridge being on opposite sides of said body.

15. An electrical connector comprising a generally rectilinear body with a series of side-by-side terminal-receiving recesses and with there being a wall between adjacent recesses, said recesses opening to opposite edges of the connector body, means in said connector body for limiting the penetration of terminals inserted into said recesses, said body including a bottom wall extending between said edges and presenting interior bottom wall surfaces for said terminal-receiving recesses and an exterior wall surface opposite thereto, and generally L-shaped ledges at one of said edges and opening toward the other edge with the lower legs of the L-shaped ledges presenting surface means progressively inclined away from the exterior wall surface opposite to said bottom wall surfaces and cooperating with the adjacent exterior wall surface to receive and support an edge of a circuit board.

16. An electrical connector comprising a body with a series of side-by-side recesses with interior wall surfaces for receiving terminals and an exterior wall surface opposite thereto, said body also including at one end thereof generally L-shaped ledge means projecting therefrom, said ledge means including tapered surface means on the lower leg of the L-shaped ledge means progressively inclined away from the exterior wall surface opposite to said bottom wall surfaces and cooperating with the adjacent exterior wall surface of the body for supporting the edges of circuit boards of varying widths.

* * * * *